United States Patent [19]

Park et al.

[11] Patent Number: 5,759,755
[45] Date of Patent: Jun. 2, 1998

[54] SEMICONDUCTOR SUBSTRATE CONTAINING ANTI-REFLECTIVE LAYER

[75] Inventors: Chun-geun Park, Suwon; Gi-sung Yeo; Jung-chul Park, both of Seoul, all of Rep. of Korea

[73] Assignee: Samsung Electronics, Co., Ltd., Rep. of Korea

[21] Appl. No.: 840,270

[22] Filed: Apr. 14, 1997

Related U.S. Application Data

[60] Continuation of Ser. No. 566,036, Dec. 1, 1995, abandoned, which is a division of Ser. No. 136,833, Oct. 18, 1993, abandoned.

[30] Foreign Application Priority Data

Aug. 8, 1993 [KR] Rep. of Korea ................... 93-18016

[51] Int. Cl.$^6$ ............................ G03C 1/825; G03C 1/835
[52] U.S. Cl. ............... 430/512; 430/271.1; 430/510; 430/514; 430/531
[58] Field of Search ........................... 430/155, 271.1, 430/510, 512, 531, 514

[56] References Cited

U.S. PATENT DOCUMENTS

| | | | |
|---|---|---|---|
| 4,362,809 | 12/1982 | Chen et al. | 430/312 |
| 4,741,926 | 5/1988 | White et al. | 427/240 |
| 4,910,122 | 3/1990 | Arnold et al. | 430/313 |
| 4,940,508 | 7/1990 | Shamouilian et al. | 156/643 |
| 5,110,697 | 5/1992 | Lamb, III et al. | 430/313 |
| 5,123,998 | 6/1992 | Kishimura | 430/313 |
| 5,265,177 | 11/1993 | Cho et al. | 385/14 |
| 5,276,126 | 1/1994 | Rogler | 430/313 |
| 5,278,010 | 1/1994 | Day et al. | 430/270 |

*Primary Examiner*—Christopher G. Young
*Attorney, Agent, or Firm*—Cushman Darby & Cushman IP Group of Pillsbury Madison & Sutro LLP

[57] ABSTRACT

A method for manufacturing an anti-reflective layer comprises the steps of coating a polymer solution containing at least one compound selected from the group consisting of phenol-based resins, water-soluble resins and acryl resins as a main component, and then baking at a high temperature. The method is simplified and the layer's reflectance is greatly enhanced.

10 Claims, 6 Drawing Sheets

SEMICONDUCTOR SUBSTRATE CONTAINING ANTI-REFLECTIVE LAYER

This is a continuation of application Ser. No. 08/566,036, filed on Dec. 1, 1995, which was abandoned upon the filing hereof which is a divisional of U.S. application Ser. No. 08/136,833, filed Oct. 18, 1993, abandoned.

BACKGROUND OF THE INVENTION

1. Field of the Invention

The present invention relates to an anti-reflective layer and method for manufacturing a semiconductor device using the same, and more particularly, to an anti-reflective layer formed by using resist composition and a method for manufacturing a semiconductor device using the same.

2. Background of Related Art

It is well known that fine patterns of a semiconductor device are formed by using photolithography. A schematic method for manufacturing patterns using the photolithography is as follows.

First, on a substrate desired to be patterned such as a semiconductor wafer, a dielectric layer or a conductive layer, a photoresist film made of organic materials which has the characteristic of changing its solubility to an alkaline solution before and after exposure to ultraviolet (UV) light, X-ray radiation etc. is formed. The resist film is selectively exposed by employing a mask pattern above the photoresist film, and then is developed to remove the portion having high solubility (in the case of a positive resist, removing the exposed portion) and leave the portion having low solubility to form resist patterns. Etching the substrate of the portion on which the resist has been removed to form patterns, and then removing the remaining resist, gives desired patterns for wiring, electrodes, etc.

Since fine patterns of high resolution can be obtained, the patterning method by the above-described photolithography is widely used. However, in order to form finer patterns, still further improvements in the manufacturing process are necessary.

The linewidth of the fine patterns formed after exposing and developing the photoresist film is required to be the same with that of the photomask at a particular reduction ratio. However, since many steps are needed in photolithography, it is very difficult to keep the linewidth of the patterns consistent. The variation of the linewidth is mainly due to a) the difference of exposing dosage owing to the difference of the thickness of resist, and b) light interference due to the diffused reflection of the light over the topography (S. Wolf and R. N. Tauber, Silicon Processing for the VLSI Era, Vol.1, p439, 1986).

Recently, the miniaturization of systems utilizing complex integrated circuitry has required chip-designed circuits of a far smaller size. Such a decrease in size, or an increase in capacity necessitates a miniaturization in the photolithography process, which could be satisfied with the use of more even topography and light of shorter wavelength.

However, the use of the higher frequency light as the exposure source results in a new problem. For example, a KrF excimer laser and DUV (deep UV) light which are expected to be used for manufacturing 256M bit DRAM (dynamic random access memory) have a shorter wavelength than the g-line, i-line, etc. If such light is used as the light source, certain defects, namely, those attributable to the reflections from a sub-layer having an uneven surface, become influential. That is, the CD difference occurs due to interference or a diffused reflection from the surface having an uneven topography.

To solve the above-mentioned problems, the coating of an anti-reflective layer is considered inevitable.

An anti-reflective layer is disclosed in U.S. Pat. No. 4,910,122. The layer is employed under a photosensitive layer such as photoresist and serves to exclude the defects attributed to the reflected light. The layer contains light absorbing dye components and is formed as an even and thin layer, so sharp photosensitive layer patterns can be manufactured by employing such a layer since the layer may absorb the light reflected from the substrate, as in a conventional method.

However, the conventional anti-reflective layer for DUV light has complicated components and limits in choosing materials. This raises production cost and makes its application difficult.

As one example of the conventional anti-reflective coating composition, a six-component mixture composition of polygamic acid, curcumin, bixin, sudan orange G, cyclohexanone and N-methyl-2-pyrrolidone is disclosed in the above-mentioned U.S. patent. This composition consists of four compounds of dye which absorb light of a specific wavelength and two solvents to dissolve the four compounds. From the exemplified composition, it is known that the composition is quite complicated and its preparation is not an easy task. Moreover, since the composition consists of many components, the problem of intermixing with the resist composition coated on the surface of the anti-reflective layer occurs, resulting in an undesirable product.

SUMMARY OF THE INVENTION

One object of the present invention considering the above-mentioned defects of the conventional anti-reflective coating composition, while eliminating the complexity of the components constituting the conventional anti-reflective coating composition and enabling single component system, as well as reducing the production cost, is to provide an anti-reflective coating composition containing novolak-based resin, water-soluble resin or polyvinylphenol-based resin which are known as raw materials of photoresists be fitting the g-line and/or i-line.

Another object of the present invention is to provide an anti-reflective layer using the coating composition of the present invention.

Further object of the present invention is to provide a method for manufacturing the anti-reflective layer of the present invention.

A still further object of the present invention is to provide a method for manufacturing a semiconductor device which is simple and gives good products through employing the anti-reflective layer of the present invention.

To accomplish the object of the present invention there is provided in the present invention an anti-reflective coating composition for a semiconductor device comprising polymer solution containing at least one compound selected from the group consisting of phenol-based resins, water-soluble resins and acrylic resins as a main component.

Another object of the present invention is accomplished by a method for manufacturing an anti-reflective layer comprising the steps of coating a polymer solution containing at least one compound selected from the group consisting of phenol-based resins, water-soluble resins and acrylic resins as a main component and baking at a high temperature.

A further object of the present invention is accomplished by an anti-reflective layer manufactured by the above-mentioned method.

A still further object of the present invention is accomplished by a method for manufacturing a semiconductor device comprising the steps of forming an anti-reflective layer through coating a polymer solution containing at least one compound selected from the group consisting of phenol-based resins, water-soluble resins and acrylic resins as a main component, and then baking at a high temperature, forming a photosensitive layer on the surface of the anti-reflective layer and exposing and developing the photosensitive layer.

BRIEF DESCRIPTION OF THE DRAWINGS

The above objects of the present invention will become more apparent by describing in detail a preferred embodiment thereof with reference to the attached drawings in which.

DETAILED DESCRIPTION OF THE INVENTION

Figure 1:
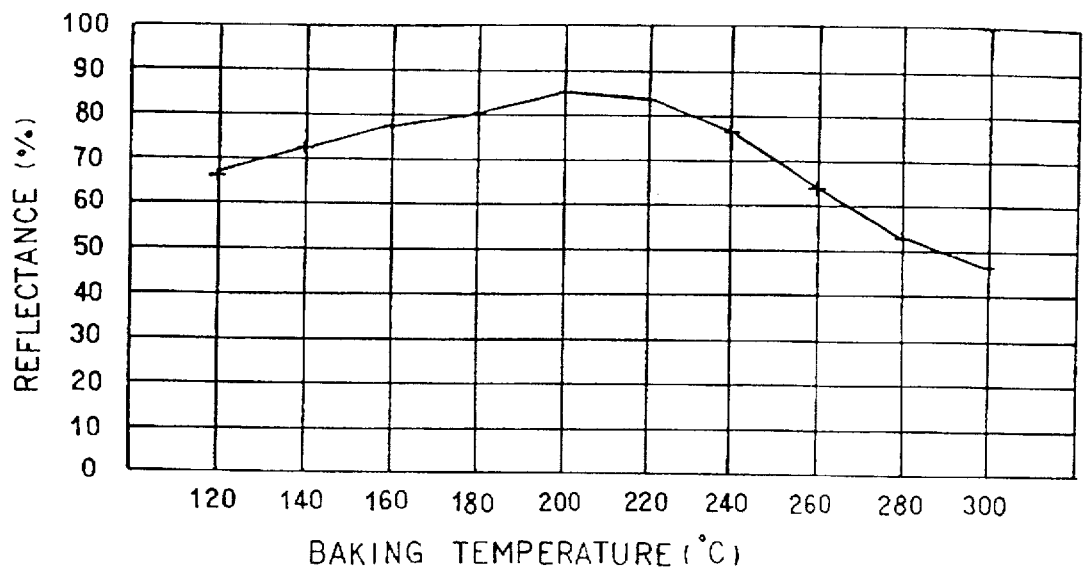
FIG. 1 is a graph showing the reflectance of 248 nm light with respect to the baking temperature after coating an anti-reflective coating composition during the manufacture of an anti-reflective layer according to the present invention.

An anti-reflective coating composition for a semiconductor device of the present invention comprises a polymer solution containing at least one compound among phenol-based resins, water-soluble resins and acrylic resins as a main component.

The preferred phenol-based resins include novolak-based resins, polyvinylphenol-based resins, a mixture thereof, or a copolymer-based resin containing at least one compound thereof and the preferred water-soluble resins include a polyvinylalcohol resin. The solvent for the polymer solution may be any one that can dissolve the resin component, and at least one selected from the group consisting of alcohols, aromatic hydrocarbons, ketones, esters and deionized water could be desirably used.

For manufacturing an anti-reflective layer of the present invention, a polymer solution containing at least one compound selected from the group consisting of phenol-based resins, water-soluble resins and acrylic resins as a main component is coated on a substrate and then the coated polymer solution is baked at a high temperature.

The high temperature baking is preferably carried out under an ambient or oxygen atmosphere at the temperature range of from 200° C. to 400° C. for 30 seconds to 5 minutes, and the preferred thickness of the coated layer after the high temperature baking is less than 1500 Å.

A soft baking process to remove the solvent may be carried out after the coating process to form the anti-reflective layer but before the high temperature baking, and is preferably carried out at 100° C. to 250° C. for 30 seconds to 5 minutes.

The thickness controlling process of the coating layer may be included after the soft baking and is preferably carried out by removing the upper portion of the coating layer before high temperature baking using at least one solvent selected from the group consisting of alcohols, aromatic hydrocarbons, ketones, esters and deionized water.

The use of the polymer solution containing at least one of the phenol-based resins, water-soluble resins such as polyvinylalcohol, and acrylic resins as a main component as in the present invention means that the conventional resist could be used. The present invention is characterized in that a baking process is employed to impart the light-absorbing function to the resin. The high temperature baking induces thermal reaction of each resin, and through the thermal reaction, the molecular structure of the resin changes by oxidation and then the resin can absorb the DUV light. Through the present invention, a thin film of the coated resin could be formed, and since the thickness of the anti-reflective layer can be controlled, the efficiency of the anti-reflective layer can be optimized at steps especially and difficulties occurring during an etching process can be minimized.

The particular basic steps of the method for manufacturing the anti-reflective layer according to the present invention is as follows.

First, a resin is coated on a substrate by a coating method such as a spin coating. Optionally, the resin may be first baked to remove the solvent and remove the upper portion of the resin using a solvent such as alcohols, aromatic hydrocarbons, ketones, esters, deionized water. The thickness of the resin can be controlled by controlling the temperature during the first bake and solvent treating time, if needed. If a coating layer having a desirable thickness is obtained at the resin coating step, this process may not be needed. Next, high temperature baking is carried out so that the resin layer acquires light absorbing characteristics. Through this high temperature baking, the resin layer is endowed with anti-reflective characteristics.

The anti-reflective layer and effects obtained therefrom will be described in detail referring to the attached drawings.

FIG. 1 represents the relation between baking temperature and reflectance of the resin. The anti-reflective layer was manufactured by the same manner as described in Example 1. But that baking temperature was varied and then the reflectance at 248 nm was measured and plotted with respect to the baking temperature.

From the figure, it can be known that the reflectance is maximum at about 200° C. and gradually reduces as the baking temperature increases. At 300° C., it lowers to about 45% and the coating layer changes to a 248 nm-light absorbing body. It is also known that as the baking temperature increases, a layer having a better anti-reflection effect can be manufactured. According to the inventors' experiment, the preferred baking temperature was found to range from 200° C. to 400° C. If the baking temperature is higher than 400° C., the resin is liable to change to an undesirable constitution owing to phenomenon such as the burning of the resin, and if the baking temperature is lower than 200° C., the solvent in the coating layer is not completely removed and results in an intermixing with the photoresist components coated on the anti-reflective layer afterward. Therefore, the above-mentioned temperature range is preferred, with a more preferred temperature range being from 260° C. to 320° C.

Figure 2:
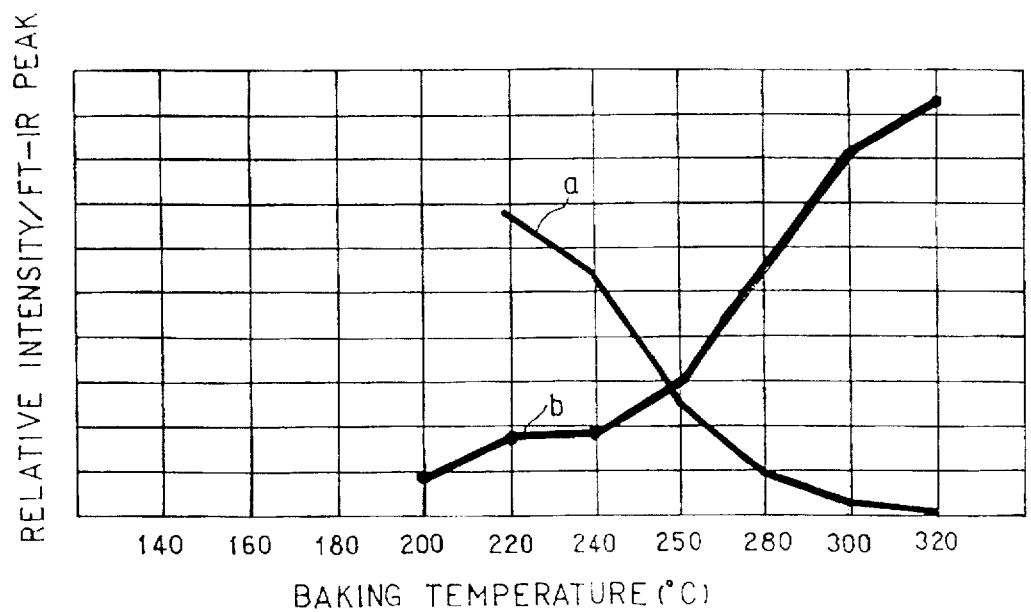
FIG. 2 is a graph showing the relative intensity variation of FT-IR peak with respect to the baking temperature during manufacture of an anti-reflective layer according to the present invention, in which "a" corresponds to about 1500 $cm^1$ peak, and "b" corresponds to about 1720 $cm^1$.

FIG. 2 is a graph showing the relative intensity variation of the Fourier transform-infrared (FT-IR) peak with respect to the baking temperature during manufacture of the anti-reflective layer according to Example 1 (described later), in which "a" corresponds to about 1500 cm$^{-1}$ peak, and "b" corresponds to about 1720 cm$^{-1}$.

From the plot "a" which represents the variation of 1500 cm$^{-1}$ peak with respect to the baking temperature in this figure, it is confirmed that the peak gradually reduces as the temperature increases and abruptly reduces above 260° C. Since the peak corresponds to the aromatic carbon-carbon double bond, this means that the aromatic carbon-carbon double bond decreases. Altogether, it is certain that the structure of the resin changes.

Meanwhile, from the plot "b" which represents the variation of 1720 cm$^{-1}$ peak with respect to the baking temperature, it is known that the peak abruptly increases for temperatures above 260° C. and at temperatures above 300° C., the peak is the maximum on the contrary to the plot "a". Since the IR peak of the 1720 cm$^{-1}$ corresponds to the C=O bond, it is assumed that the C=O bond in the novolak resin structure increases. That is, the amount of oxygen in the resin increases through the baking and this kind of change in molecular structure of the conventional novolak resin produces a transformed resin which has an enhanced characteristic of absorbing 248 nm light.

Figure 3A:
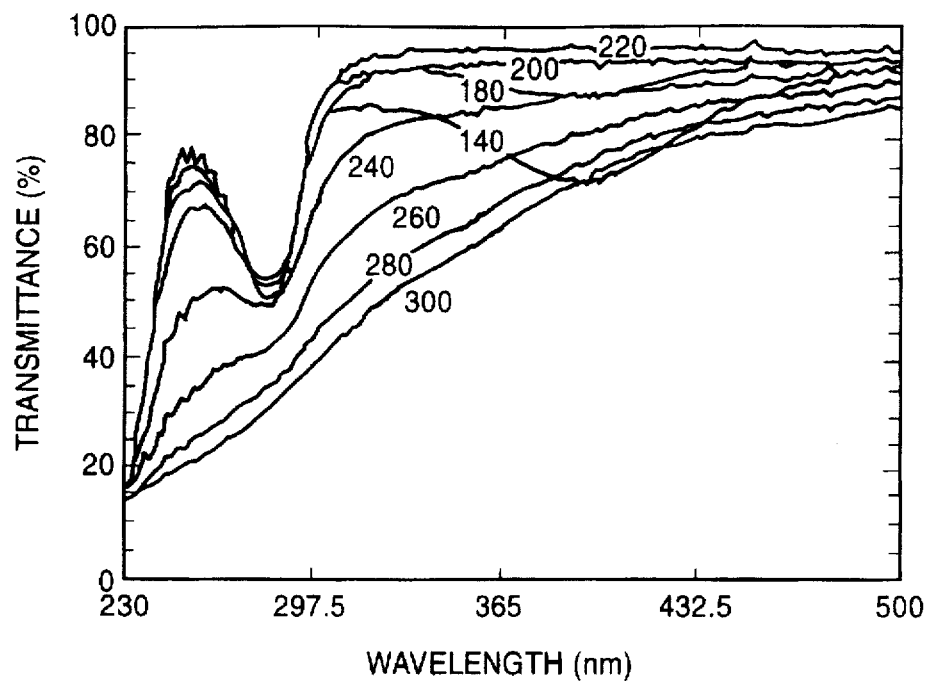
FIGS. 3A and 3B are graphs showing the transmittances of anti-reflective layers with respect to the wavelengths of the UV light at various baking temperatures, in which (FIG. 3A) corresponds to the 150 nm thick anti-reflective layer made from a polymer composition composed of novolak-based resin+diazonaphtoquinone (DNQ)-based photoactive compound (PAC), and (FIG. 3B) corresponds to a 500 nm-thick anti-reflective layer made from novolak-based resin.
Figure 3B:
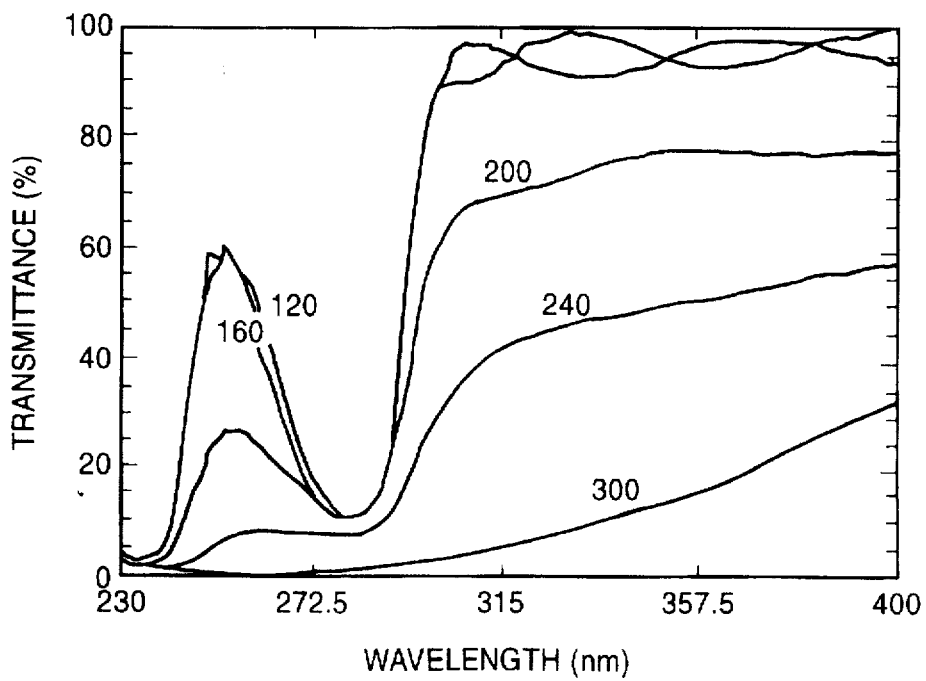

FIGS. 3A and 3B are graphs showing the transmittances at various wavelengths of the anti-reflective layers in various baking temperatures, in which (FIG. 3A) corresponds to the 150 nm thick anti-reflective layer made from polymer composition composed of novolak-based resin+DNQ-based PAC, and (FIG. 3B) corresponds to the 500 nm thick anti-reflective layer made from novolak-based resin.

From FIGS. 3A and 3B, it is found that the transmittance lowers (meaning that resin absorbance increases) as the baking temperature increases. This effect comes from the resin baking. The anti-reflective layer of the present invention formed by baking at especially high temperature has the effect of absorbing at wide wavelength region.

The present inventors observed the transmittance changes for the anti-reflective layers formed from polymer consisting of novolak resin+DNQ-based PAC with a 150 nm thickness and from novolak resin with 500 nm thickness. From the result, it can be found that the decrease of the transmittance was not due to the photosensitive material, DNQ but due to the structure change of the novolak-based resin by thermal reaction.

Therefore, the photosensitive material, which is the major cost among the components of the conventional resist composition, need not be included in the anti-reflective coating composition of the present invention.

Figure 4:
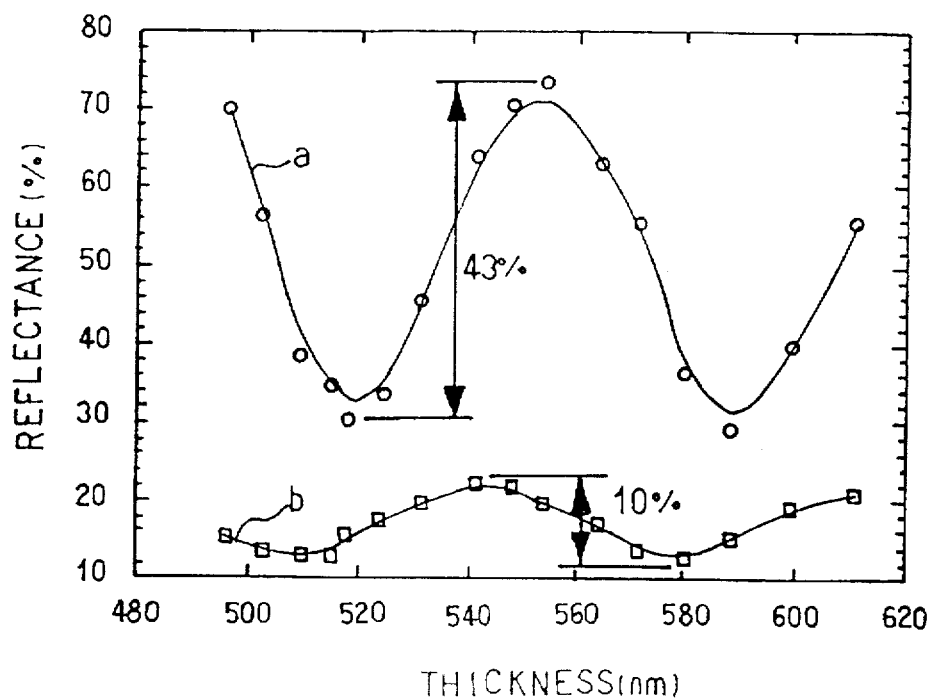
FIG. 4 is a graph showing the reflectance at 248 nm light, in which "a" corresponds to the case without employing an anti-reflective layer, while "b" corresponds to the case employing an anti-reflective layer made by the method of the present invention.

FIG. 4 is a graph showing the reflectance of the photoresist at 248 nm wavelength, in which "a" corresponds to the case without employing an anti-reflective layer, while "b" corresponds to the case employing an anti-reflective layer made by the method of the present invention.

The reflectance of the photoresist layer without employing baked resin as the anti-reflective layer is high, and the reflectance variation with respect to the thickness also is large, with the maximum difference being 43%. However, the reflectance of the photoresist layer employing the baked resin as the anti-reflective layer is low (less than 30%) throughout the whole thickness and the maximum variation is 10%.

Figure 5:
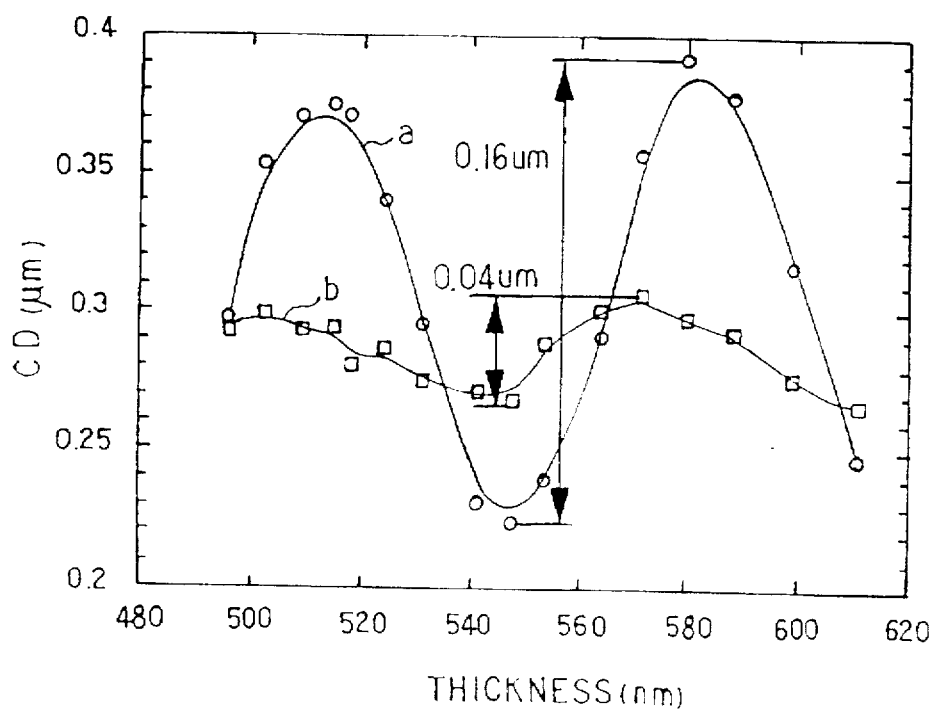
FIG. 5 is a graph showing the critical dimension (CD) variation of the patterns formed by using 248 nm light, in which "a" corresponds to the case without employing an anti-reflective layer, while "b" corresponds to the case employing an anti-reflective layer made by the method of the present invention.

FIG. 5 illustrates graphs showing the variation of CD (critical dimension) of the pattern formed using 248 nm wavelength, in which "a" corresponds to the case without employing an anti-reflective layer, while "b" corresponds to the case employing an anti-reflective layer made by the method of the present invention.

From FIG. 5, it is confirmed that the CD variation for the patterns formed without employing the anti-reflective layer is large and the maximum is 0.16 μm, while the maximum CD variation for the patterns formed by employing the anti-reflective layer is 0.04 μm.

Figure 6:
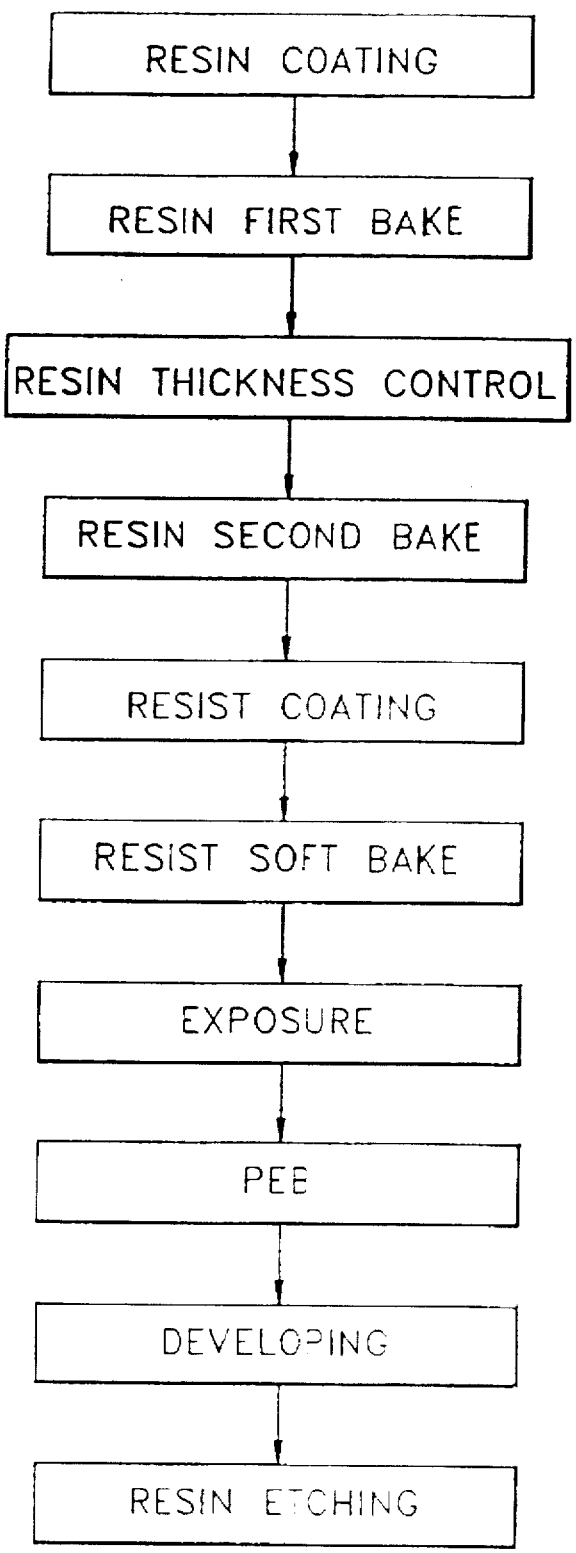
FIG. 6 illustrates a process flow of manufacturing a semiconductor device using the anti-reflective layer according to one embodiment of the present invention.
Figure 7A:
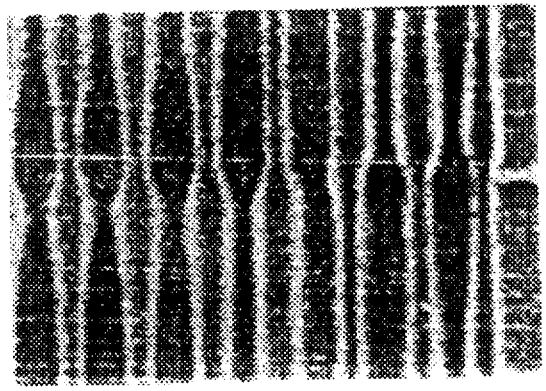
FIGS. 7A–7D are SEM photographs showing the characteristics of the pattern at 300 nm steps manufactured by the conventional single resist method, in which the linewidths of the patterns in A, B, C and D are 0.30 μm, 0.32 μm, 0.34 μm, respectively, and 0.36 μm, and the thickness of the resists are all 0.5 μm.
Figure 7B:
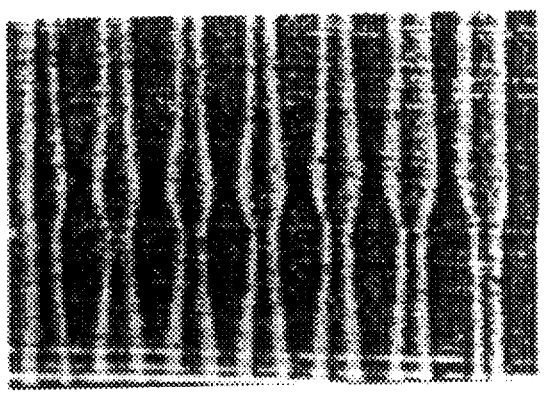
Figure 7C:
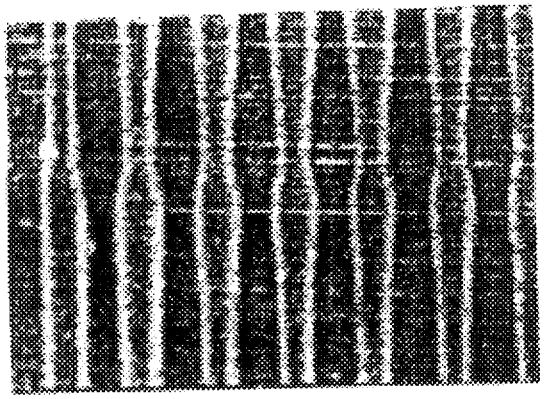
Figure 7D:
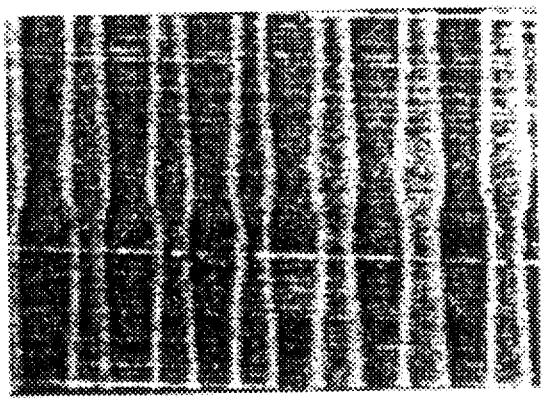

FIG. 6 illustrates a process flow of manufacturing a semiconductor device using the anti-reflective layer according to one embodiment of the present invention. Referring to the FIG. 6, the preferred embodiment for manufacturing a semiconductor device according to the present invention will be described with concrete numerical values.

First, an aluminum layer is formed on a substrate and then resin is coated by a spin coating method on the aluminum layer. Then apply soft bake at about 210° C. for about 50 seconds, and then at about 120° C. for about 50 seconds to remove solvents. Multi-step soft bake enhances the evenness of the layer.

Next, the upper portion of the resin layer is removed using a solvent such as ethylcellosolve acetate by a puddling method and then the remaining layer is dried by spinning. This thickness controlling step could be omitted if not needed. Commonly, the thickness controlled layer through the surface removing has enhanced evenness. The thickness of the layer can be easily controlled by regulating the baking temperature according to the kind of solvent used.

After then, high temperature baking is carried out to give the resin anti-reflective function at 250° C. or more on a hot plate for 50 seconds or more, for example, at 300° C. for about 90 seconds. Through this second baking, the resin is oxidized and becomes a light absorbing body. As the temperature of this second baking increases, the reflectance reduces.

A resist pattern is formed on the thus-obtained anti-reflective layer through a conventional lithography process including resist coating, exposing, baking (post exposure bake or PEB), and developing. At this time, the resist film and the anti-reflective layer could be patterned separately by patterning the resist to form resist patterns and then etching the anti-reflective layer using the resist pattern as a mask. Thereafter, the aluminum layer under the anti-reflective layer is patterned by etching. The anti-reflective layer could be etched and patterned during etching the aluminum layer.

The preferred embodiments of the present invention will be described in detail below.

EXAMPLE 1

On a silicon substrate, MC kasei BL-1, 2CP(trade name manufactured by Mitsubishi kasei), a novolak-based resist, was spin coated at 5200 rpm for 30 seconds give to a 1300 Å thickness. The coating layer was soft baked on a hot plate at 210° C. for 50 seconds, and then again for 50 seconds at 100° C. to remove solvent. The thickness of the layer was adjusted to 700 Å using ethylcellosolve acetate by a puddling method for 60 seconds. A final baking step at 300° C. for 90 seconds gave an anti-reflective layer according to the present invention. The reflectance to 248 nm light after baking was lowered to 45% of a bare silicon wafer.

Resist film was formed by a conventional method and resist patterns were formed through exposing, developing, etc. Thereafter, an etching process was carried out.

XP89131 (trade name manufactured by Shipley Co.) was used as a photoresist and the thickness of the resist film was at least 0.8 μm since its thickness will be decreased during etching. A Nikon EX1755 stepper (trade name manufactured by Nikon Co., Ltd) using a KrF excimer laser was used as the lightsource. An aqueous TMAH (tetrmethylammoniumhydroxide) solution was used as a developing solution, and $Cl_2$ and $O_2$ were employed for etching the anti-reflective layer in a time etch manner.

Following the above conditions, L/S (line/space) dimension of 0.30 μm was obtained, even for a 3000 Å step.

EXAMPLE 2

An anti-reflective layer of the present invention was manufactured by the same manner as described in Example 1, except for using polyvinylphenol-based resist instead of novolak-based resist. The reflectance was lowered to 45% under the same conditions.

EXAMPLE 3

An anti-reflective layer of the present invention was manufactured by the same manner described in Example 1, except for using pure novolak resin instead of novolak-based resist. Here, the weight average molecular weight (Mw) was 6.000 and the Mw-to-Mn (weight average molecular weight to number average molecular weight) ratio was seven. The same effect as in Example 1 was obtained.

Comparative Example

Resist patterns were formed by the same manner as described in Example 1 except that the anti-reflective layer was not formed.

FIGS. 7A–7D are SEM photographs showing pattern characteristics for a 300 nm step manufactured by the conventional single resist method without employing an anti-reflective layer, in which the linewidths of the patterns are 0.30 μm, 0.32 μm, 0.34 μm and 0.36 μm, respectively, and the thicknesses of the resists are all 0.5 μm.

Figure 8A:
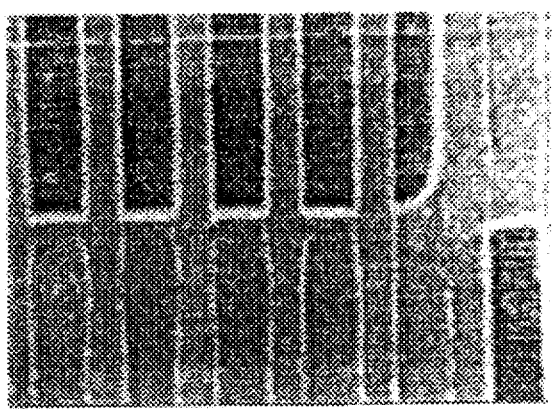
FIGS. 8A and 8B are SEM photographs showing the characteristics of the pattern at 300 nm steps manufactured by employing an anti-reflective layer of the present invention, in which the thicknesses of the resists in A and B are 0.5μm and 0.8 μm, and the linewidths of the pattern are all 0.3 μm.
Figure 8B:
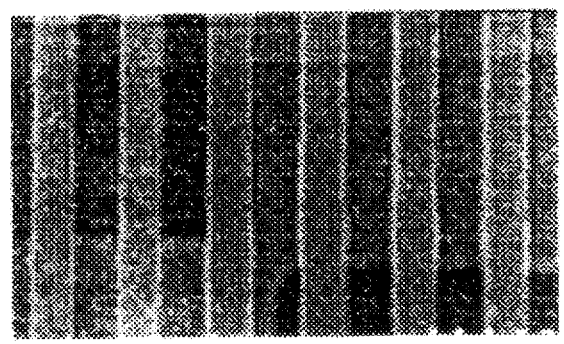

FIGS. 8A and 8B are SEM photographs showing pattern characteristics for a 300 nm step manufactured by employing an anti-reflective layer of the present invention, in which the thicknesses of the resists in FIG. 8A and FIG. 8B are 0.5 μm and 0.8 μm, respectively, and the linewidths of the pattern are both 0.3 μm.

From FIGS. 7A–7D and 8A & 8B, it is confirmed that the resist patterns manufactured by using the anti-reflective layer of the present invention has an even better profile.

As described above, the present invention relates to an anti-reflective layer employed to eliminate the defects caused by the reflection of the exposed light from the substrate. The problems of complex component selection and high cost for the conventional anti-reflective layer are settled, and since a single component can be employed, the solvent can be selected easily. Also, a pattern having a good profile is obtained by using the anti-reflective layer manufactured using the composition of the present invention, which ultimately makes it possible to produce semiconductor devices having good quality.

Moreover, since film thickness could be freely controlled during the forming of a coating layer, the effect of the anti-reflective layer can be optimized especially at steps, and problems occurring during etching after photolithography process can be minimized.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A photosensitive, semiconductor substrate for making a semiconductor device comprising:

a substrate;

an anti-reflective layer formed on a surface of said substrate, said anti-reflective layer having a thickness below 1500 angstroms, said anti-reflective layer comprising at least one cured and baked layer comprising at least one resin selected from the group consisting of phenol resins, water-soluble resins and acrylic resins as a main component, wherein said at least one resin in said baked layer has an increased number of carbonyl groups compared to the amount of carbonyl groups present in said at least one resin in an unbaked form, said increased number of carbonyl groups being proportioned to said baked layer being baked at a minimum temperature of about 250° C.; and a photoresist layer formed on said anti-reflective layer.

2. A photo-sensitive substrate according to claim 1, wherein said substrate is selected from the group consisting of a semiconductor wafer, a dielectric layer and a conductive layer.

3. A photo-sensitive substrate according to claim 1, wherein said at least one resin is selected from the group consisting of novolak resins, vinylphenol resins, mixtures thereof, and copolymers comprising at least one of a novolak resin or vinylphenol resin as a main component.

4. A photo-sensitive substrate according to claim 1, wherein a structure of said at least one resin changes by oxidation.

5. A photo-sensitive substrate according to claim 1, wherein said anti-reflective layer is made by the method of:

baking said at least one resin for a time sufficient to increase a number of carbonyl groups in said at least one resin under an ambient or oxygen atmosphere.

6. A photo-sensitive substrate according to claim 5, wherein said baking is carried out at a temperature up to 400° C. for a period from 30 seconds to 5 minutes.

7. A photo-sensitive substrate according to claim 1, wherein said anti-reflective layer is substantially free of dyes.

8. A photo-sensitive substrate according to claim 1, wherein said anti-reflective layer absorbs deep UV light.

9. A photo-sensitive substrate according to claim 1, wherein said anti-reflective layer absorbs light at about the 248 nm wavelength region.

10. A photo-sensitive substrate according to claim 1, wherein said substrate is a dynamic random access memory chip substrate.

* * * * *